(12) United States Patent
Kang et al.

(10) Patent No.: US 10,073,124 B2
(45) Date of Patent: Sep. 11, 2018

(54) ELECTRONIC METER SEAL ARRANGEMENT AND METHOD

(71) Applicant: Landis+Gyr, LLC, Lafayette, IN (US)

(72) Inventors: Hua Kang, Lafayette, IN (US); David Schamber, Lafayette, IN (US)

(73) Assignee: Landis+Gyr, LLC, Lafayette, IN (US)

(*) Notice: Subject to any disclaimer, the term of this patent is extended or adjusted under 35 U.S.C. 154(b) by 0 days.

(21) Appl. No.: 15/323,381

(22) PCT Filed: Jul. 2, 2015

(86) PCT No.: PCT/US2015/039129
§ 371 (c)(1),
(2) Date: Dec. 30, 2016

(87) PCT Pub. No.: WO2016/004400
PCT Pub. Date: Jan. 7, 2016

(65) Prior Publication Data
US 2018/0172741 A1    Jun. 21, 2018

Related U.S. Application Data

(60) Provisional application No. 62/020,385, filed on Jul. 2, 2014.

(51) Int. Cl.
*G01R 1/00*   (2006.01)
*G01R 22/06*  (2006.01)
*G01R 11/24*  (2006.01)

(52) U.S. Cl.
CPC ............ *G01R 22/066* (2013.01); *G01R 11/24* (2013.01); *G01R 22/065* (2013.01)

(58) Field of Classification Search
CPC .... G01R 11/24; G01R 22/061; G01R 22/063; G01R 22/066; G01R 22/10; G01D 4/002; G01D 4/00
See application file for complete search history.

(56) References Cited

U.S. PATENT DOCUMENTS 4,361,877 A    11/1982  Dyer et al.
4,707,679 A *  11/1987  Kennon ............... G01F 15/007
                                                   307/39

(Continued)

OTHER PUBLICATIONS

International Search Report and Written Opinion for PCT/US2015/039129, dated Sep. 17, 2015.

*Primary Examiner* — Minh N Tang
(74) *Attorney, Agent, or Firm* — Maginot, Moore & Beck LLP (57) ABSTRACT

A method is used in a utility meter having an arm bit and a seal bit. The method includes changing a state of the arm bit to a first state in response to a first set of conditions. The method also includes removing electrical power from the meter. Upon subsequently applying electrical power to the meter, a first signal in a meter processing circuit indicates whether a meter cover is installed or the meter cover is removed. The processing circuit changes the seal bit to a first state responsive to a condition in which the arm bit is in the first state and the first signal indicates that the meter cover is installed. The processing circuit changes the seal bit to a second state responsive to a condition in which the seal bit is in the first state and the first signal indicates that the meter cover is removed.

17 Claims, 6 Drawing Sheets

(56) References Cited

U.S. PATENT DOCUMENTS

| | | | |
|---|---|---|---|
| 5,940,009 A | 8/1999 | Loy et al. | |
| 6,232,886 B1 | 5/2001 | Morand | |
| 6,236,197 B1 | 5/2001 | Holdsclaw | |
| 7,936,163 B2 * | 5/2011 | Lee, Jr. | G01R 22/066 324/110 |
| 2008/0266133 A1 | 10/2008 | Martin | |
| 2012/0079870 A1 | 4/2012 | Ramirez | |
| 2013/0119974 A1 | 5/2013 | Chamarti et al. | |
| 2013/0293219 A1 | 11/2013 | Ramirez et al. | |
| 2014/0091946 A1 | 4/2014 | Landis | |
| 2014/0125316 A1 | 5/2014 | Landis | |

\* cited by examiner

ELECTRONIC METER SEAL ARRANGEMENT AND METHOD

This application is a national phase of the International Patent Application No. PCT/US2015/039129, filed Jul. 2, 2015, and claims the benefit of U.S. Provisional Patent Application Ser. No. 62/020,385, filed Jul. 2, 2014, which is incorporated herein by reference.

FIELD OF THE INVENTION

The present invention relates generally to utility meters, and more specifically, to utility meters having electronic memory.

BACKGROUND OF THE INVENTION

Electrical service providers such as electrical utilities employ electricity meters to monitor energy consumption by customers and other entities. Electricity meters track the amount of energy consumed by a load (e.g. the customer), typically measured in kilowatt-hours ("kwh"), at each customer's facility. The service provider uses the consumption information primarily for billing, but also for resource allocation planning and other purposes.

Many electricity meters employ digital circuitry to determine energy consumption and other billing values. For example, it is known to use digital signal processors to calculate energy consumption from digital energy measurement signals. The calculated consumption information is then displayed on a meter display. From time to time, a meter reader from the utility obtains the consumption information displayed on the customer's meter display to facilitate billing. In the alternative, or in addition, the meter may include transmission capabilities for transmitting consumption information to a remote utility computing device, thereby also facilitating billing.

Electrical power is transmitted and delivered to load in many forms. For example, electrical power may be delivered as polyphase wye-connected or delta-connected power or as single phase power. Such various forms are known as service types. Different standard electricity meter types, known as meter forms, are used to measure the power consumption for the various service types. The commonly used meter forms in the United States include those designated as 2S, 3S, 5S, 45S, 6S, 36S, 9S, 16S, 12S and 25S meter forms, which are well known in the art.

As discussed above, a primary purpose of metering is to determine energy usage by a load (customer) for the purposes of accurate billing. It is therefore known that tampering with an electricity meter can result in reduced billing charges, and stolen energy. Typical tampering techniques involve either disabling the meter itself, or bypassing the meter completely. Many types of tampering involve removal of the meter cover or removal of the meter itself. Removal of the meter cover, for example, can allow for disabling or adjustment of the meter circuitry. In some cases, the circuitry may be disabled and/or adjusted and the meter cover replaced in order to mask the tamper event.

To combat energy theft via tampering, it is known to provide mechanical switch mechanisms that are triggered by cover removal, meter removal, impact, and other common operations related to tampering. Such mechanical switches generate outputs that are detected by the meter processing circuitry, which may then record the event for display or transmission to the utility. Many of these methods, however, can be overcome via advanced mechanical skills and meter structural knowledge.

In many cases a meter can record or log a tamper event in an electronic memory, so that the service provider can obtain tampering information when it communicates with the meter. In a typical case, a technician from the service provider obtains tamper information from the meter via a communication port. The tampering issue can then be resolved and the event erased from memory. However, it has been determined in some regions that more and/or alternative means of detecting tampering should be employed, including that which may be carried out by service provider technicians.

SUMMARY OF THE INVENTION

The present invention addresses the above-stated needs, as well as others, by providing an electronic sealing method and apparatus that involves a set of activities required to put a meter in a sealed state, and which involves changing the sealed state when the meter cover is removed.

A first embodiment is a method that is used in a utility meter having an arm bit and a seal bit. The method includes changing a state of the arm bit to a first state in response to a first set of conditions. The method also includes removing electrical power from the meter. Upon subsequently applying electrical power to the meter, a first signal in a meter processing circuit indicates whether a meter cover is installed or the meter cover is removed. The processing circuit changes the seal bit to a first state responsive to a condition in which the arm bit is in the first state and the first signal indicates that the meter cover is installed. The processing circuit changes the seal bit to a second state responsive to a condition in which the seal bit is in the first state and the first signal indicates that the meter cover is removed.

A second embodiment is an arrangement that carries out the method.

The above-described features and advantages, as well as others, will be readily apparent to those of ordinary skill in the art by reference to the following detailed description and accompanying drawings.

DETAILED DESCRIPTION

Figure 1:
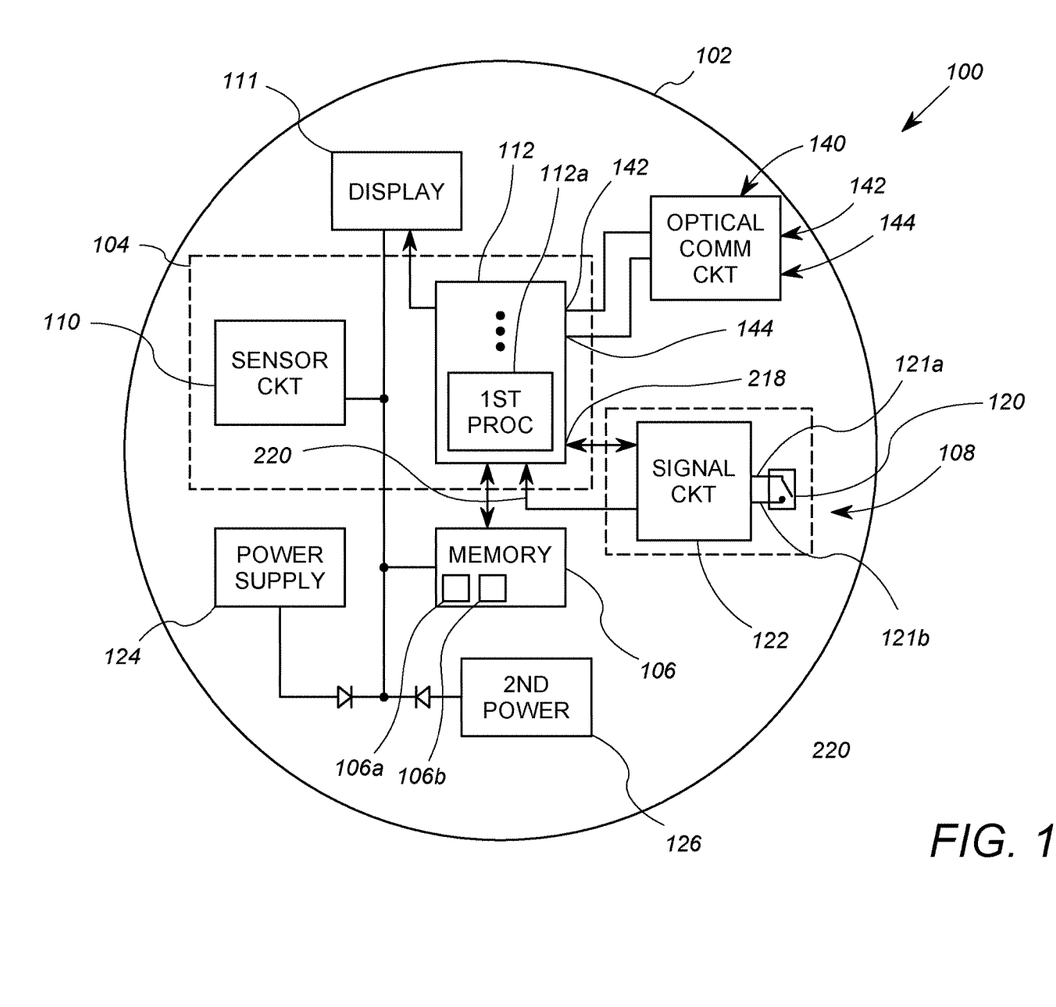
FIG. 1 shows an exemplary meter that incorporates first embodiment of the invention.

FIG. 1 shows an exemplary electricity meter 100 that incorporates an electronic sealing method and apparatus that involves a set of activities required to put the meter in a sealed state 100, and which involves changing the sealed state when the meter cover is removed. The meter 100 in this embodiment includes a meter housing 102, which supports a metrology circuit 104, a memory 106, a cover removal detector 108, a processing circuit 112, an optical communication circuit 140, a power supply 124 and a secondary power source 126. The processing circuit 112 may suitably also form part of the metrology circuit 104.

Figure 2:
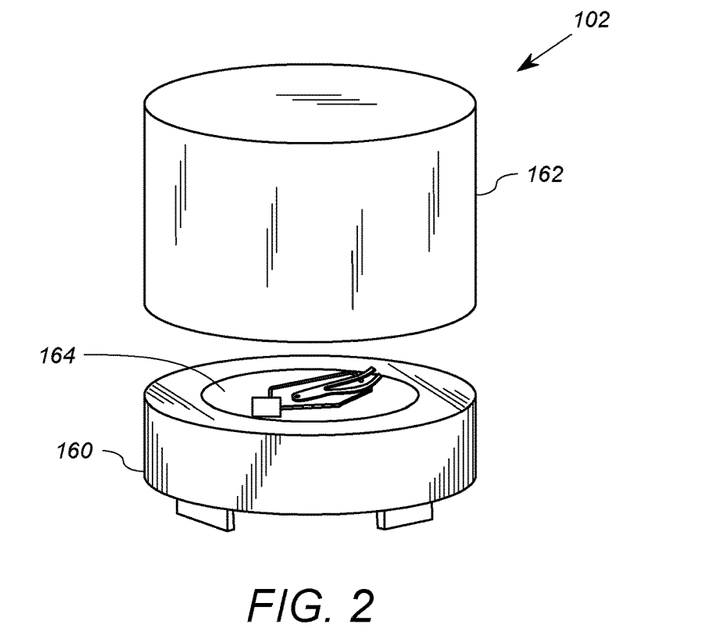
FIG. 2 shows a perspective view of the meter of FIG. 1.

The meter housing 102 further supports a display 111, which is operably connected to the processing circuit 112 in a conventional manner to display energy consumption information as well as other information. FIG. 2 shows a perspective view of the meter 100 showing the general structure of the meter housing 102. As shown in FIG. 2, the meter housing 102 includes a meter base 160 and a meter cover 162. The meter base 160 includes a circuit board 164 affixed thereto. The circuit board 164 supports and provides interconnection to many of the circuit elements shown in FIG. 1, such as the processing circuit 112, at least part of the sensor circuit 110, the power supply 124, the secondary power source 126, the memory 106 and the detector circuit 108. The meter base 160 also supports the display 111. The meter cover 162 fits over the meter base 160, and provides security and environmental protection for the internal components of the meter 100. When the meter cover 162 is installed, the internal components supported within the meter base 160 are physically inaccessible.

Referring again to FIG. 1, the metrology circuit 104 is any suitable circuit that is configured to detect electricity delivered to the metered load, not shown in FIG. 1, and generate energy consumption-related information therefrom. Such circuits are well-known in the art. In this embodiment, the metrology circuit 104 includes a sensor circuit 110 and at least some of the functions of the processing circuit 112. The sensor circuit 110 in this embodiment includes voltage sensors and current sensors, not shown in FIG. 1, which sense electricity delivered to the load, and generate analog electricity measurement signals therefrom. The processing circuit 112 includes circuitry that converts the analog electricity measurement signals to digital measurement signals, and digital processing circuitry that calculates various energy-consumption related values based on the digital measurement signals. The processing circuit 112 may suitably include one or more processing devices, including a meter processor 112a, as is known in the art.

The memory 106 in this drawing is representative of a non-volatile memory, such as flash memory or the like. However, it will be appreciated that the memory 106 may be a set of memories that includes one or more of flash memory, non-volatile RAM, and even volatile memory. Moreover, the processing circuit 112 also includes working memory, such as RAM, as is known in the art. In this embodiment, the memory 106 includes a first location 106a for storing a bit representative of a "seal bit", and a second location 106b for storing a bit representative of an "arm bit". The first and second locations 106a, 106b may be absolute, or may be dynamically assigned. The memory 106 also includes other locations for storing other values, flags, and the software executed by processing elements of the processing circuit 112.

The power supply 124 is a circuit that provides bias power to the processing circuit 112 and other circuit elements during normal operation of the meter 100. To this end, the power supply 124 obtains electrical energy from the utility power lines and generates the necessarily DC bias voltages for the processing circuit 112 and other circuits. Such power supplies are conventional in the metering art.

The secondary power source 126 is a circuit that provides temporary power to one or more circuits such as the processing circuit 112 on a temporary basis when utility power is not available to the power supply 124. The secondary power source 126 typically includes at least one energy storage device such as a battery and/or capacitors. U.S. patent application Ser. No. 13/464,374, which is owned by the same owner as the present application, and which is incorporated herein by reference, shows an exemplary circuit for providing temporary back-up power for metering devices.

The cover removal detector 108 is an arrangement of elements that is configured to detect meter cover removal and provide suitable signals to the processing circuit 112 for recordation, display or communication of the detected mechanical event. In the exemplary embodiment described herein, the cover removal detector 108 is configured to detect and signal the removal of the meter cover 162 from the meter base 160. To this end, the cover removal detector 108 includes at least one mechanical switch 120, conductors 121a, 121b and a signal circuit 122. Although not visible in FIG. 2, the mechanical switch 120, the conductors 121a, 121b and the signal circuit 122 are all disposed on the circuit board 164. The conductors 121a, 121b may suitably be traces defined on the surface of the circuit board 164.

The mechanical switch 120 is a device including contacts that make or break electrical connection based on mechanical activity corresponding to a potential tamper event. To this end, the mechanical switch 120 is configured to make (closed) and break (open) an electrical connection between the conductors 121a, 121b. In this embodiment, the mechanical switch 120 may include a set of electrical contacts that complete a connection between the conductors 121a, 121b when the meter cover 162 is removed from (i.e. disconnected from or separated from) the meter base 160. By contrast, when the meter cover 162 is properly installed on the meter base 160, then the mechanical switch 120 breaks the connection between the conductors 121a, 121b. It will be appreciated that there are many conceivable arrangements of a switch 120 that closes when the meter cover 162 is removed and opens when the meter cover 160 is installed. The details of implementation of such an arrangement could take many forms, and would be known to those of ordinary skill in the art. The inventive features discussed herein are applicable to any such configuration.

Figure 3:
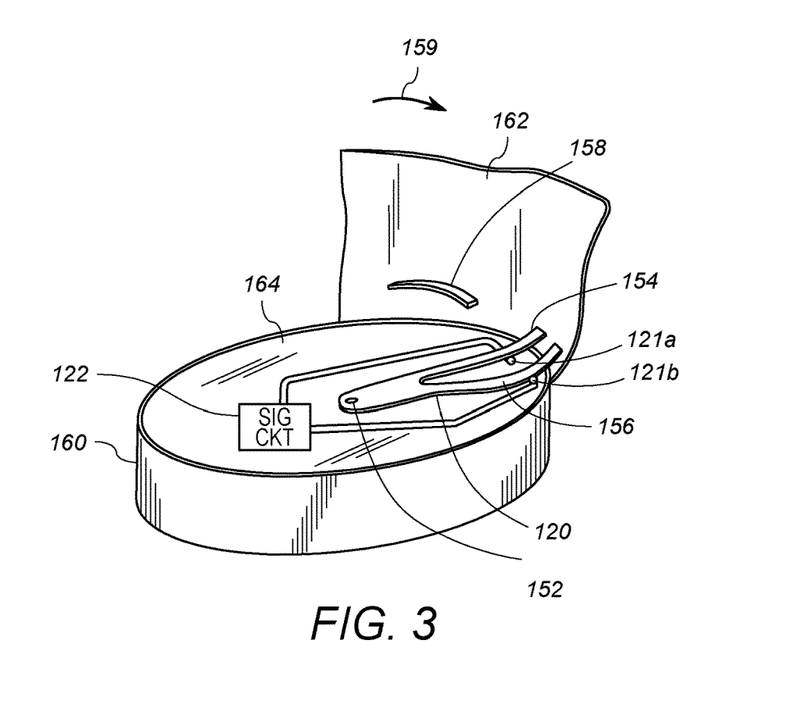
FIG. 3 shows a fragmentary perspective view of the meter of FIG. 1.

By way of example, FIG. 3 shows a representative, fragmentary perspective view of an exemplary mechanical switch 120 and corresponding arrangement for making and breaking the connection between the conductors 121a, 121b based on whether the meter cover 162 is installed on the meter base 160. Referring to FIG. 3, the mechanical switch 120 includes a U-shaped conductor having a first end 152 coupled to the circuit board 164, and arms 154, 156 extending therefrom. The arms 154, 156 are spring-biased towards the circuit board 164, such that if unimpeded, the arms 154, 156 will mechanically and electrically contact, respectively, the conductors 121a, 121b. In FIG. 3, the cover 162 is not completely installed, and therefore the arms 154, 156 are in contact with, and complete the connection between, the conductors 121a, 121b.

The meter cover 162 in this embodiment includes an inclined inner ledge 158 that is positioned such that when the meter cover 162 is rotated into the closed position, (in the direction 159 of FIG. 2a), the inner ledge 158 urges or cams the arms 154, 156 upward off of the circuit board 164, thereby breaking the connection between the conductors 121a, 121b. To this end, the ends of the arms 154, 156 extend upwards as then extend toward the inner surface of the cover 162. As a consequence, the inner ledge 158, as is rotates toward the closed position, can push the arms 154, 156 upward as the inclined surface of the inner ledge 158 continues to rotate through to the radial position of the arms 154, 156.

In yet other embodiments, another mechanical switch 120 may be one that makes contact responsive to impact forces or tilting of the meter. Such mechanical switches are known and may readily be employed within the cover removal detector 108 in place of, or in addition to, the switch 120. The seal bit operations of the present invention may be implemented with any arrangement for detecting meter cover removal both when utility power is present within a meter, and when utility power is not present within the meter.

In any event, the signal circuit 122 in this embodiment is a circuit that is operably connected to determine whether the conductors 121a, 121b are connected (via closed switch 120) or disconnected (via open switch 120). The signal circuit 122 is further configured to generate, responsive to the detection of a connection between the conductors 121a, 121b, two output signals. The two output signals include a first output signal and a latched output signal. The first output signal is a signal that is triggered, among other things, anytime the switch 120 changes state. The latched output signal is a signal that indicates the present state of the switch, except that the signal is latched for a short time after a transition. The signal circuit 122 is operably connected to provide the first output signal and the latched output signal to one or more inputs of the processing circuit 112, as will be discussed below in detail. The use of the latched signal allows for the detection of a momentary opening of the switch to be detected. Examples of a suitable signal circuit and arrangement for detecting a change in the status of the switch 120 may be found in U.S. Patent Publication No. 2014/0125316, published May 8, 2014, which is incorporated herein by reference.

It will be appreciated that the signal circuit 122 may alternatively be configured to generate the first output signal and the latched output signal responsive to a temporary opening of the mechanical switch 120, as opposed to temporary closing of the mechanical switch 120. In such a case, the mechanical switch 120 would be normally closed, and only opened upon detection of a mechanical event. Such an alternative, however, may require more energy from the secondary power source 126, and therefore would be less preferable.

Referring now to the processing circuit 112, in addition to the operations as part of the metrology circuit 104, the processing circuit 112 performs operations involving supervisory functions, display functions, and other functions within the meter 100. To perform all of such functions of the processing circuit 112, the processing circuit 112 includes at least a first processor 112a and in some cases multiple processors. The processor 112a in this embodiment is a Teridian 71M6533 metering integrated circuit (IC) available from Maxim Integrated Products. However, it will be appreciated that other processing devices may be used.

In general, the processor 112a, and hence the overall processing circuit 112, has a first mode and a second mode. In the first mode, the processor 112a performs a first set of metering operations related to energy metering, as discussed above. In the second mode, the processor 112a performs a second set of operations in the second mode, the second set of operations having fewer operations than the first set of operations. The second mode is often referred to as a sleep mode, and is a reduced power state with minimal functionality. In the second mode, the processor 112a is in the reduced power (sleep mode) state and other circuitry of the processing circuit 112 may not be powered all. Accordingly, the processing circuit 112 consumes less energy in the second mode than in the first mode.

To this end, in the first mode or "active mode", the processor 112a and other components of the processing circuit 112 receive operating bias power from the power supply 124. The processing circuit 112 operates in the active mode when utility power is available to the meter. In the second mode or "sleep mode", the processor 112a is operably connected to receive power from the secondary power source 126, and other portions of the processing circuit 112 receive no operating power. The processing circuit 112 is in the sleep mode primarily when utility power is not available to the meter 100. In the sleep mode, the first processor 112a ceases substantially all of its operations in the supervisory, display and metrology functions of the meter 100. The first processor 112a is configured to resume active mode, and such functions, upon restoration of utility power. In the sleep mode, the processing circuit 112 is capable, upon receiving the first output signal from the signal circuit 122, temporarily "wake-up" to perform certain operations. One of the operations is to record the state of the latched output signal from the signal circuit 122, which indicates the current state of the cover 162 (as latched for a short time). The processing circuit 112 can record an indication of cover removal ("cover removal flag") in the memory 106 if the latched output signal from the signal circuit 122 indicates that the cover is removed, or record a "cover closed" indication if the latched output signal indicates otherwise. As will be discussed below, the cover removal flag is used in other operations as in indication that the cover 162 had been removed during a power outage.

In accordance with aspects of the present invention, the processing circuit 112 is configured (programmed) to perform a set of start-up operations that that are configured to manage a tamper flag that can only be armed, set, and cleared under a particular set of conditions, in order to provide a more resilient and quasi-permanent record of tamper events. To this end, the processing circuit 112 is configured to perform a set of start-up operations upon application of bias power to an input thereof, and is configured by program instructions to change a state of the arm bit in memory location 106b to a first state (armed) in response to a first set of conditions. In performing the start-up operations, the processing circuit 112 obtains a first signal from the signal circuit 122 indicating whether the meter cover 162 is installed or the meter cover 162 is removed. The processing circuit 112 changes the state of the seal bit in memory location 106a to a first state (sealed) in response to a condition in which the arm bit is in the first (armed) state and the first signal indicates that the meter cover 162 is installed. The processing circuit 112 is configured to change the state of the seal bit to a second state (unsealed) in response to a condition in which the seal bit is in the first state and the first signal indicates that the meter cover 162 is removed. The multiple steps and conditions required to set the seal bit helps ensure that the seal bit cannot be easily or accidentally set again after a tamper event.

As will be discussed further below, the processing circuit 112 is further configured to, in performing the start-up operations, obtain a second signal (e.g. the stored "cover removal flag") indicating whether the meter cover 162 was removed after a last time that power was applied to the meter. As will be discussed below in detail, the processing circuit 112 in the sleep state can store an indication of meter cover removal using signals received from the signal circuit. The processing signal 112 is further configured to change the seal bit to the second state in response to a condition in which the seal bit is in the first state and the second signal indicates that the meter cover 162 was removed after a last time that power was applied to the meter. The seal bit is preferably stored in non-volatile memory, such as the memory 106, or even non-volatile memory disposed within the processing circuit 112. FIGS. 4-7, discussed further below, show in further detail the operations of the processing circuit 112 in connection with the electronic seal bit operations in this exemplary embodiment.

The processing circuit further includes two I/O ports 142, 144 operably connected to the optical communication circuit 140. The I/O ports 142 and 144 and the optical communication circuit 140 cooperate to allow the processing circuit 112 to communicate with devices external to the meter housing 102, such as portable computing devices or the like.

Normal Metering Operations

Referring again generally to FIGS. 1 and 2, during normal operation, the power supply 124 uses the utility power and generates biasing power for the processing circuit 112, the display 111 and other circuitry within the meter 100. Accordingly, the processing circuit 112 and the processor are in the active mode. The metrology circuit 104 operates to detect and measure electrical energy consumption (or related values) delivered from the utility power lines to the load. The processing circuit 112 assists in such energy consumption measurement and further causes energy consumption information to be displayed on the display 111. As is conventional, display of energy consumption information allows for a meter reader to obtain information used by the utility service provider for billing, as well as other purposes. In alternative embodiments, the processing circuit 112 may cause the energy consumption information to be transmitted to a remote meter reading device, not shown, via a transmission device, also not shown. The above operations are conventional in the metering industry, and may take many forms. The processor 112a may perform many or all of these functions of the processing circuit 112.

In addition, during normal operation, the meter cover 162 is installed on the base 160, and as such the mechanical switch 120 is the open state, in this embodiment. The state of the switch may suitably be detected on the input 220, which is connected to receive the latched output signal of the signal circuit 122, discussed above. The latched output signal is latched to cover certain contingencies discussed further below. However, in steady state the latched output signal on the input 220 to the processing circuit 112 indicates the current state of the meter cover 162.

In further detail, when the mechanical switch 120 is in the open state, the signal circuit 122 detects that the conductors 121a, 121b are not electrically coupled. As such, the signal circuit 122 does not provide a latched output signal (or provides a latched output signal in an open state) to the first processor 112a. However, if due to a tampering attempt such as removal of the meter cover 162 from the meter base 160, the mechanical switch 120 is temporarily closed, then the signal circuit 122 generates the latched output signal and provides the latched output signal to the first processor 112a. The first processor 112a stores information indicative of a detected mechanical event, i.e., the cover removal flag, in the memory 106. The first processor 112a may further cause an indication of the event to be displayed on the display 111, or communicated via a communication device. Further detail regarding the operations of the processing circuit 112 under conditions in which the meter cover 162 is removed is provided below in connection with FIG. 6.

Power Outage Meter Operation

In the event of a power outage or power interruption, the power supply 124 can no longer generate bias power for the processing circuit 112, the display 111 and other circuits. Accordingly, the secondary power source 126 provides bias power to at least some of the circuits within the meter 100. However, one or more circuits of the meter 100 are disabled to conserve the power in the secondary power source 126. In this embodiment, for example, the first processor 112a goes into sleep mode. The signal circuit 122, however, is operably connected to receive power from the secondary power source 126 when the primary supply 124 no longer generates bias power.

In such a case, as long as the meter cover 162 is installed on the meter base 160, the mechanical switch 120 remains in the open state. As a consequence, the signal circuit 122 does not generate either the first output signal or the latched output signal. However, if the meter cover 162 is removed, then the mechanical switch 120 closes. As a consequence, the signal circuit 122 provides the first output signal and the latched signal to the respective inputs 218, 220 of the processor 112a.

The first output signal is preferably provided to an input 218 on the processor 112a that causes the processor 112a to temporarily "awaken" from a sleep mode. Inputs that awaken a processor in sleep mode are known. For example, the Teridian metering IC referenced above operates to transition the Teridian meter processing chip from a low power consumption mode wherein meter calculations do not take place to a higher power consumption mode wherein meter processing occurs. In many cases such a transition from a sleep mode to an active mode can take one second or more.

After the processor 112a transitions temporarily to the active mode, it then determines whether an input signal is present at its second input 220, i.e., the latched output signal from the signal circuit 122. If so, then the processing circuit 112 determines that the meter cover 162 has been removed, or had been removed when the processing circuit 112 was in the sleep mode. In general, the processing circuit 112 records such an event (e.g. setting the cover removal flag) in the memory 106. In some cases, the processor 112a may further cause an indication of the event to be displayed on the display 111, and/or causes an indication of such event to be communicated remotely (if the meter 100 includes a remote communication device). In any event, the processor 112a may thereafter re-enter the sleep mode until power is fully restored to the primary power supply 124. After the power is restored to the meter 100, the processing circuit 112 obtains the cover removal flag and processes the removal in the manner described below in connection with FIG. 5.

U.S. Patent Publication No. 2014/0125316, referenced above, describes in detail an exemplary arrangement for detecting meter cover removal during active mode and during a power outage, using a latching signal.

However, it will be appreciated, however, that the details of how the processing circuit 112 obtains information regarding the current state of the meter cover 162, and whether the meter cover 162 had been removed in a time period in which power was not provided to the meter 100, may take other forms. Moreover, other cover removal detection techniques can be used to generate the cover removal flag both during a power outage and during normal power.

The seal bit operations of the present invention may be implemented with any arrangement for detecting meter cover removal both when utility power is present within a meter, and when utility power is not present within the meter.

Commissioning and Installation

Figure 7:
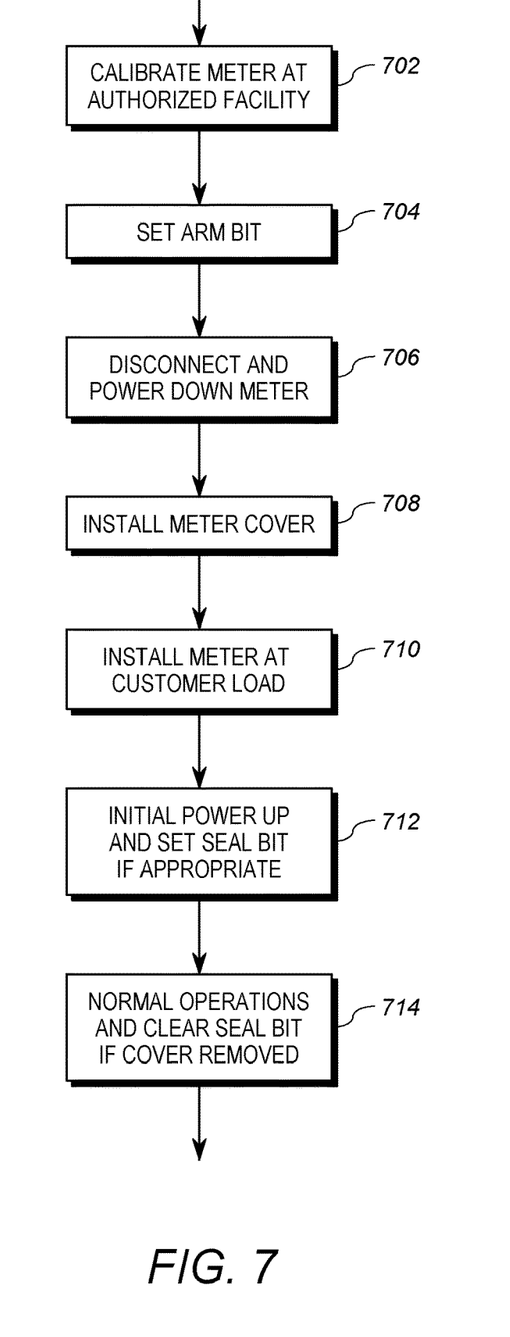
FIG. 7 shows a flow diagram of the operations of calibrating, installing and operating the meter of FIG. 1.

The electronic "seal" (e.g. seal bit and arm bit) operations of the meter processing circuit 112 are best understood in the context of the life arc of the meter 100. This arc is generally shown in FIG. 7. In a typical (but not exclusive) scenario, the arm bit of the meter 100 is set during final calibration at the factory or commissioning facility. When the meter 100 is installed and powered up at the customer load, the seal bit of the meter is set as long as the cover 162 had not been removed after the arm bit was set. If at any time the cover 162 is removed during normal meter operation, then the seal bit is cleared, and cannot be set again until the arm bit is again set at an authorized facility.

In further detail, before installation, the meter 100 is initially calibrated at a special facility that has authorization to arm the meter 100 (step 702). To this end, an external computing device (with arming authorization), not shown, communicates calibration information to the meter processing circuit 112 via the optical communication circuit 140. It is at this time, under normal circumstances, that the processing circuit 112 sets the arm bit in the memory location 106*b* (step 704). Further details regarding these operations are provided below in connection with FIG. 4.

In step 706, the external computing device is disconnected, and the meter 100 is powered down and removed from the authorized facility. In step 708, the meter 162 installed is placed on the meter 100 and the meter is packed for shipment.

In step 710, the meter 100 is transferred and installed at a customer's facility. In step 712, the meter 100 is powered up, and the processing circuit 112 determines whether the arm bit is set, and whether the cover 162 has been removed since the 162 cover was installed in step 708. If the arm bit is set, and the cover 162 has not been removed, then the processing circuit 112 sets the seal bit at the memory location 106*a*. If either of those conditions is not met, then the processing circuit 112 does not set the seal bit and other action may be taken. Further details regarding the operations of step 710 are provided below in connection with FIG. 5.

Figure 6:
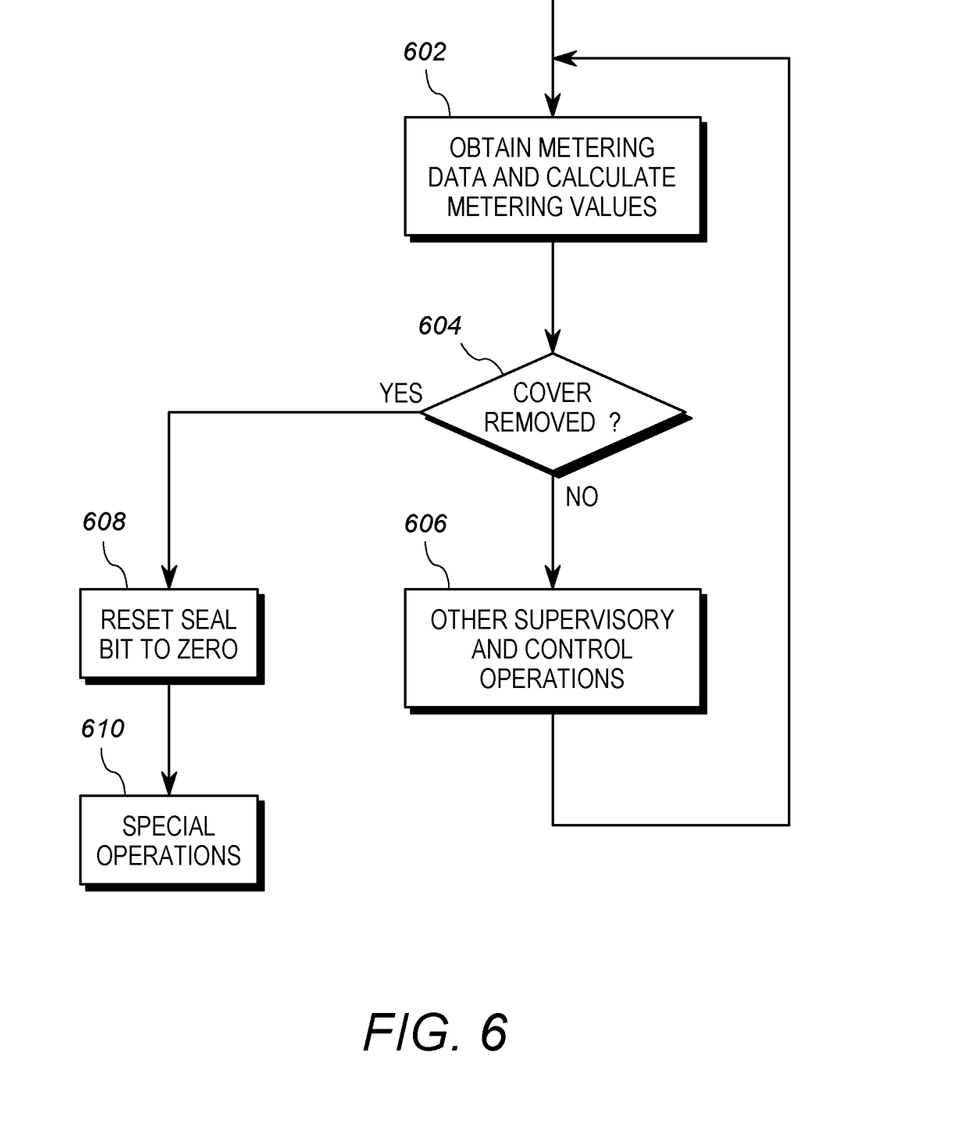
FIG. 6 shows a flow diagram of exemplary operations of a processing circuit of the meter of FIG. 1 performing normal operations for electricity metering.

Thereafter, in step 712, the meter 100 performs normal metering operations, which include monitoring for removal of the cover 162 as discussed above in connection with FIGS. 1 and 2. In the course of these operations, the processing circuit 112 clears the seal bit if a cover removal flag is detected. FIG. 6 shows in further detail the operations of the processing circuit 112 during normal operation.

Processing Circuit Operations

Figure 4:
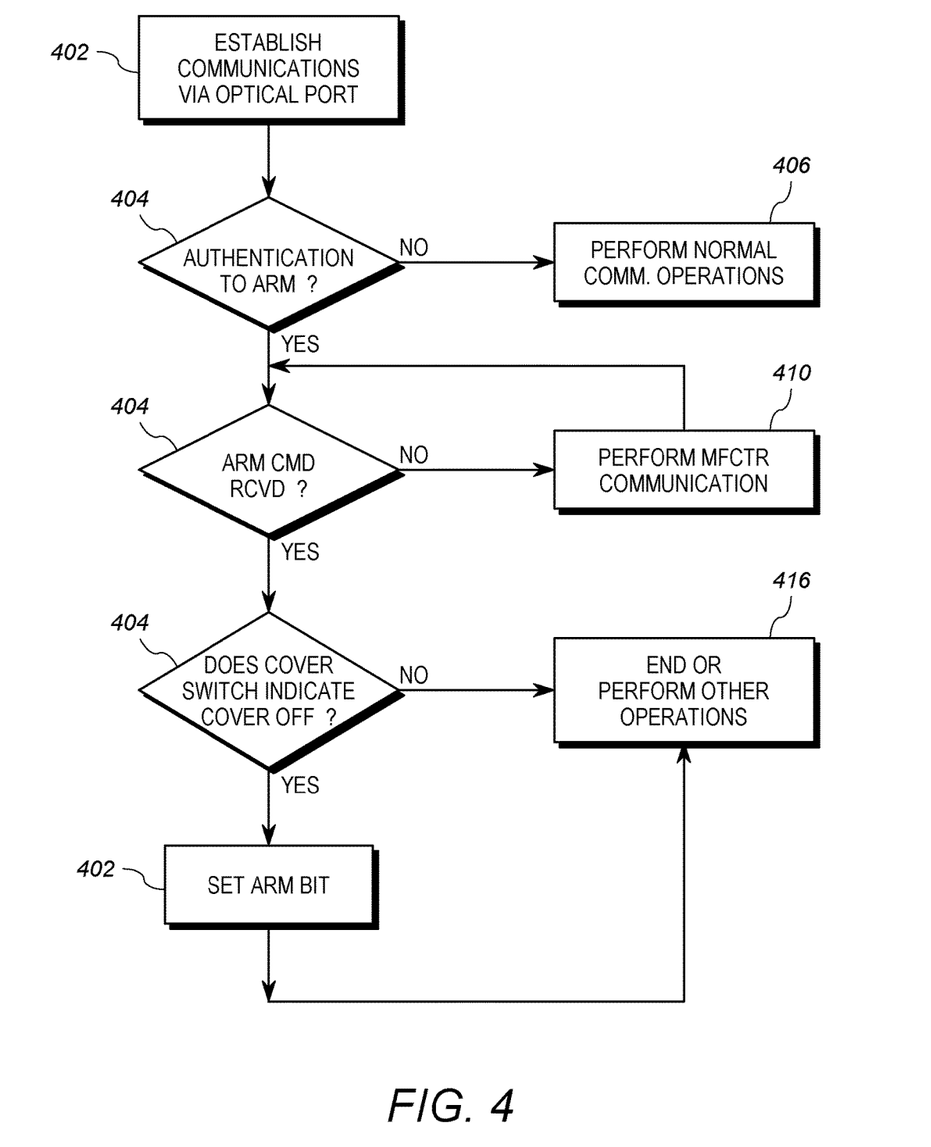
FIG. 4 shows a flow diagram of exemplary operations of a processing circuit of the meter of FIG. 1 performing communications with external devices in accordance with at least one embodiment of the invention.
Figure 5:
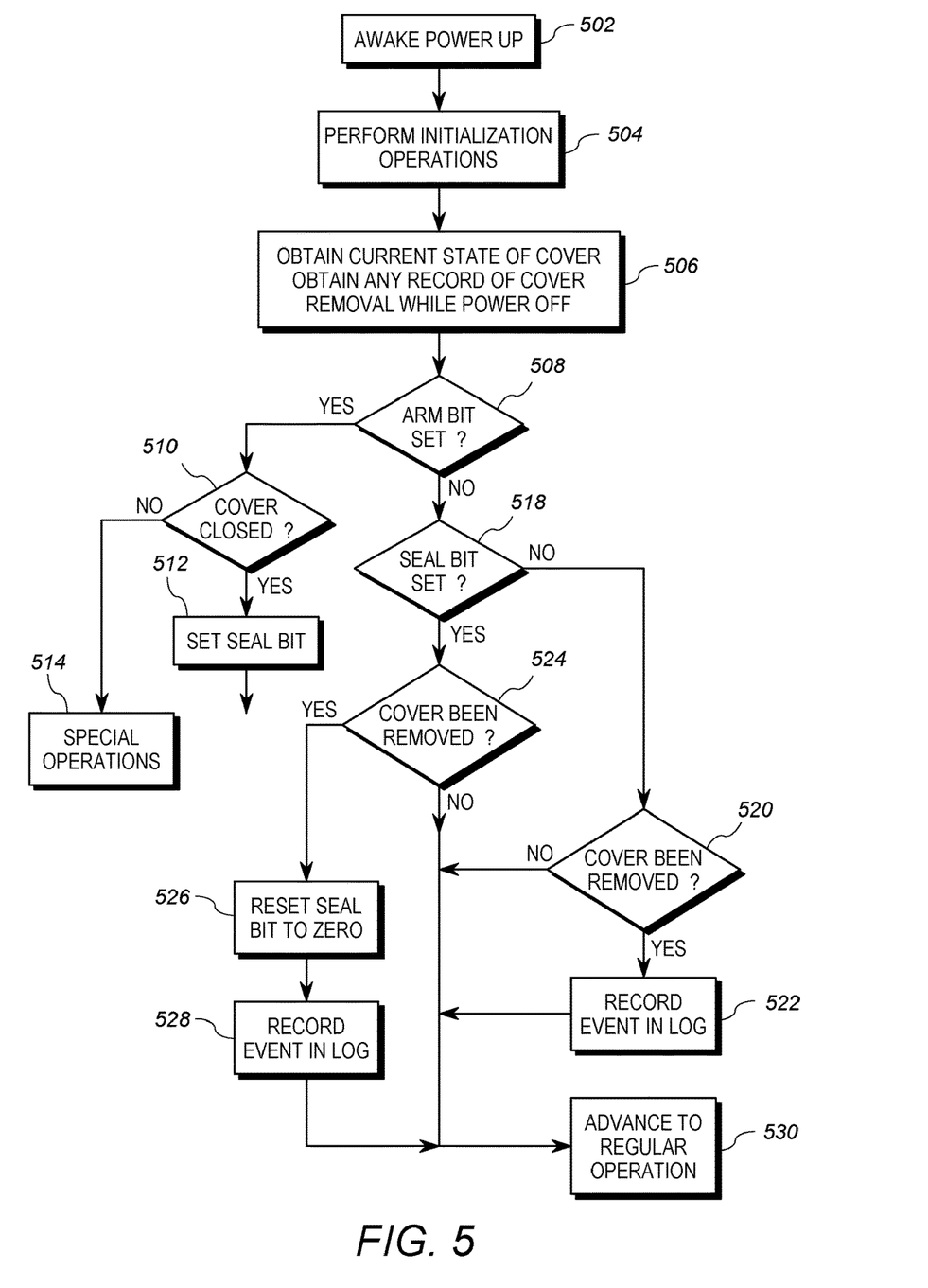
FIG. 5 shows a flow diagram of exemplary operations of a processing circuit of the meter of FIG. 1 performing start-up procedures when power is applied to the meter after the removal of power from the meter.

FIGS. 4-6 show in further detail the operations performed by the processing circuit 112. The various operations may be implemented as software stored in the memory 106 and executed by the processing circuit 112.

Processing Circuit Operations for Communication

FIG. 4 shows a set of operations that are performed by the processing circuit 112 whenever communications are established with an external device via I/O ports 142 and 144. As discussed above, the I/O ports 142, 144 of the processing circuit 112 are operably coupled to the optical port 140 of the meter 100. In the embodiment described here, the optical port 140 is used to configure, calibrate and interrogate the processing circuit 112 using an external, but on-site, computing device. The use of an optical port for the exchange of data between the processing circuit of a meter and an external computing device is generally known. However, FIG. 4 shows a specific set of operations that carry out the novel operations of at least one embodiment of the present invention in this configuration.

In general, the operations of FIG. 4 occur when the meter 100 is being calibrated at the factory as per steps 702, 704 of FIG. 7. The operations of FIG. 4 also occur whenever a field device (portable computing device) is connected to and communicating with the meter 100 after the meter has been installed, during normal metering operations (step 712).

FIG. 4, specifically, shows the operations of the processing circuit 112 apart from the external device with which it is communicating. The external device, not shown, may suitably be a portable meter reader computer used in the field, or a configuration computer used in a manufacturing or commissioning facility. Both of such items are known in the art.

Initially, in step 402, the processing circuit 112 establishes communications with an external computing device, via the optical port 140 and I/O ports 142 and 144. In step 404, the processing circuit 112 determines whether it has received an authentication code to arm the meter 100, or in other words, set the arm bit. In general, it is contemplated that only manufacturing or commissioning facilities will have computing devices capable of providing an authentication to arm the meter 100. The authentication code may, for example, be an indication of the class of external computing device. Accordingly, only specially designated facilities will have the ability to arm the meter.

If the processing circuit 112 determines that an authentication to arm the meter 100 has not been received, then, the processing circuit 112 proceeds to step 406. In step 406, the processing circuit 112 performs standard data communications with the external computing device via the optical port 140. Such standard communications can include providing metering data to the external computing device, or providing event logs, or other information stored within the meter. Such standard communications can also include receiving software upgrades or new calibration values from the external computing device. Such data exchange via the optical port 140 of a meter is conventional, and the details of which are omitted for purposes of clarity of exposition.

If, however, the processing circuit 112 determines in step 404 that an authentication to arm the meter 100 has been received, then the processing circuit 112 proceeds to step 408. In step 408, the processing circuit 112 determines whether an "arm" command has been received. If not, then the processing circuit 112 proceeds to step 410 to perform other communications with the external computing device. If so, however, then the processing circuit 112 proceeds to step 412, discussed further below.

In further detail, of steps 404 and 408, it will be appreciated that in some cases, external devices that have an authentication to arm the meter 100 will perform other operations that do not arm the meter 100. To this end, certain external computing devices, such as those in a manufacturing facility or commissioning facility may have the authentication (or ability) to arm a meter, but also be used for many other processes that do not include arming the meter 100. Thus, step 404 in this embodiment merely determines whether the processing circuit 112 is in communications with an external device with the ability to arm the meter 100. In step 408, the processing circuit 112 determines whether that external device is actually trying to arm the meter, as opposed to performing some other function.

Thus, in step 410, the processing circuit 112 performs some other operation involving communications with the external computing device. Such other operations can involve setting of calibration values, additional programming, or other initialization operations. The processing circuit 112 after each communication, or at least periodically, return to step 408 to determine if arm command is received. In other words, during the time the authenticated external device is connected, the processing circuit 112 may monitor for receipt of the arm command. As long as other commands or communications are received, the processing circuit 112 continues to perform the associated communication operations per step 410.

As discussed above, the processing circuit 112 performs step 412 when an "arm" command is received. In step 412, the processing circuit 112 determines whether the cover switch 120 indicates that the cover 162 is currently removed. If so, then the processing circuit 112 sets the arm bit in step 414. To this end, the processing circuit 112 sets a bit in a predetermining memory location in the memory 106. Thus, if the arm command is received and the cover 162 is removed, then the arm bit is set.

However, if the processing circuit 112 determines in step 412 that the cover switch 120 does not indicate that the cover 162 is removed from the base 160, then the processing circuit 112 ends the communication operation in step 416, without setting the arm bit.

The above operations thereby provide a predetermined set of conditions that must be satisfied to "arm" the meter 100 for the setting of the seal bit. These conditions include that the processing circuit 112 be in communication, via the optical port 140, with a device authorized to set the arm bit. The conditions also include receiving the command to set the arm bit while the meter cover 162 is removed. This sequence of steps is selected as a resilient method to prevent inadvertent or unauthorized arming of the meter 100 for the setting of the seal bit.

Processing Circuit Operations Upon Power-Up

As discussed above, the processing circuit 112 has a start-up mode or set of start-up operations that are performed after being in the sleep mode, or otherwise not having full power. FIG. 5 shows a flow diagram of an exemplary set of start-up operations performed by the processing circuit 112 in accordance with the embodiment of the invention described herein. These operations occur when the meter 100 is first installed, as per step 710 of FIG. 7. The operations of FIG. 5 also occur whenever the meter 100 recovers from a power outage or power interruption, during otherwise normal metering operations (step 712)

Referring specifically to FIG. 5, in step 502, the processing circuit 112 receives the bias power indicating to enter the normal operating mode. Thereafter, in step 504, the processing circuit 112 performs normal initialization operations, including initializing real-time clocks and the like. Such operations are routine.

In step 506, the processing circuit 112 obtains the current state of the meter cover 162, and any indication as to whether the meter cover 162 had been removed while the processing circuit 112 was in sleep mode (or some other non-normal operating state). As discussed above in connection with FIGS. 1-3, the processing circuit 112 sets a cover removal flag responsive to signals from the switch 120 (via the signal circuit 122) when in sleep mode. Thus, in step 506, the processing circuit 112 identifies whether cover removal flag has been set since the loss of power.

Thereafter, in step 508, the meter processor 112 determines whether the arm bit is set. If the arm bit is set, then the processor 112 proceeds to step 510. If the arm bit is not set, then the processor 112 proceeds to step 518.

Referring to step 510, the processing circuit 112 determines whether the cover switch 120 indicates that the cover 162 is closed. If so, then the processing circuit 112 sets the seal bit in step 512. In other words, the processing circuit 112 stores a predetermined flag value (set bit) in a location 106a in the memory 106. Thus, a start-up operation when the cover 162 is closed/installed and the arm bit is set results in the electronic "sealing" of the meter 100. The processing circuit 112 also clears the arm bit.

If, however, in step 510, the processing circuit 112 determines that the cover switch 162 indicates that the cover is not closed (i.e. installed) when the arm bit is set, then the processing circuit 112 proceeds to step 514. In step 514, the processing circuit 112 performs a set of operations relating to the opening of the cover 162 when the arm bit is set. In some embodiments, the processing circuit 112 clears the arm bit such that the meter 100 has to go through the arm process again (FIG. 4) before the seal bit can be set. The processing circuit 112 may also store a log of the event in the memory 106 of the start-up operations being performed with the arm bit set, and the cover off. This stored log indicates that the cover 162 had been removed between the factory (or commissioning facility) and the first power-up (e.g. before installation at the customer site). Such information can be used to avoid incorrect assumptions that the customer attempted to tamper with the meter by removing the cover 162. The processing circuit 112 may thereafter shut down, or go on to normal metering operations, discussed further below.

As discussed, above, the processing circuit performs step 518 if the processing circuit 112 determines in step 508 that the arm bit is not set. In normal operation, the arm bit is not set. In any event, in step 518, the processing circuit 112 determines whether the seal bit is set. If the seal bit is set, which would typically correspond to normal conditions, then the processing circuit 112 proceeds to step 524. If the processing circuit 112, however, determines that the seal bit is not set (and the arm bit has already been determined to be not set), then the processing circuit 112 proceeds to step 520.

In step 520, the processing circuit 112 determines whether the cover is currently removed, or was removed since the last time power was removed from the meter 100. If so, then the processing circuit 112 proceeds to step 522. If not, then the processing circuit 112 advances to step 530 to perform normal metering operations, with the seal bit not set but otherwise operating normally. Thus, even if the electronic seal is "broken", the meter will otherwise operate to perform energy metering, if it is not completely compromised.

Referring again to step 522, indicating that the cover 162 had been removed (e.g. the cover removal flag is set) or that the cover 162 is currently removed (e.g. signal from the switch 120 via the signal circuit 122), the processing circuit 112 stores a data record indicating that a cover removal event has occurred. The data record is stored in a data log which is separate and apart from the seal bit, arm bit and cover removal flag. The data log helps provide storage of meter cover removal events that is maintained independent of the seal bit. The data log may be stored in the memory 106, or in other memory. The data log may include a date and time stamp and an indication that the seal bit was not set when the cover 162 was removed.

After step 522, the processing circuit 112 may suitably proceed to step 530 to perform normal metering operations. The processing circuit 112 may also initiate a remote communication event in step 522 to provide a remote utility computer with information identifying the removal of the cover of the meter 100. To this end, in some meters, a remote communication circuit, such as a radio or power line modem, is provided to allow the meter to communicate with a remote utility computer. If the meter 100 has such remote communication ability, then it may communicate the detected cover open event to the utility computer.

In any event, reference is made back to step 518. As discussed above, in step 518, the processing circuit 112 proceeds to step 524 if the seal bit is set, such as under normal conditions. In step 524, the processing circuit 112 determines whether the cover 162 is currently removed, or was removed since the last time power was removed from the meter 100. If so, then the processing circuit 112 proceeds to step 526. If not, then the processing circuit 112 advances directly to step 530 to perform normal metering operations, with the seal bit set and the meter operating normally.

In step 526, the processing circuit 112 first clears the seal bit, indicating that the electronic seal has been broken. To this end, the processing circuit 112 stores a value in the predetermined seal bit memory location that indicates that the seal bit is not set. Thus, if the seal bit is set, but a cover removal event is detected, then the seal bit is cleared to 0 ("not set"). The seal bit cannot be set again until the meter is properly armed as per the operations of FIG. 4, and the operation of steps 510 and 512 are again performed after the meter 100 is armed.

In any event, after clearing the seal bit in step 526, the processing circuit 112 proceeds to step 528. In step 528, the processing circuit 112 stores a data record indicating that a cover removal event has occurred. As discussed above, the data record is stored in a data log which is separate and apart from the seal bit (and arm bit). The data log helps provide storage of meter cover removal events that is maintained independent of the seal bit. As also discussed, above, the data log may be stored in the memory 106, or in other memory. The processing circuit 112 may also initiate a remote communication event in step 528 to provide a remote utility computer with information identifying the removal of the cover (and the clearing of the seal bit) of the meter 100. After step 528, the processing circuit 112 may suitably proceed to step 530 to perform normal metering operations.

Processing Circuit Operations in Normal Operation

FIG. 6 shows a flow diagram of an exemplary set of operations of the meter processing circuit 112 after start-up has been completed. In step 602, the processing circuit 112 performs normal metering operations such generating, storing and communicating energy consumption values. The processing circuit 112 also performs supervisory operations, including monitoring the state of the switch 120. Accordingly, in step 604, which may be concurrent with the ongoing operations of step 604, the processing circuit 112 determines whether the cover 162 has been removed via the state of the switch 120. If not, then the processing circuit 112 performs any other supervisory operations in step 606 and returns to (and/or continues to) step 602.

If the processing circuit 112 determines that the cover 162 has been removed, then the processing circuit 112 clears the seal bit (if it is currently set), and records the event in the separately stored log, such as discussed above (regardless of whether the seal bit is set). (Step 608). The processing circuit 112 may then perform special operations, such as displaying an indication of the removal event. (Step 610).

It will be appreciated that the above described embodiments are merely illustrative, and that those of ordinary skill in the art may readily devise their own implementations and modifications that incorporate the principles of the present invention and fall with within the spirit and scope thereof.

What is claimed is:

1. A method for use in a utility meter, utility meter having a first memory location having an arm bit and a second memory location having a seal bit, comprising:
   a) changing a state of the arm bit to a first state in response to a first set of conditions;
   b) removing power from the meter;
   c) applying electrical power to the meter;
   d) upon applying electrical power to the meter, providing a first signal to a processing circuit in the meter indicating whether a meter cover is installed or the meter cover is removed;
   e) using the processing circuit to change the state of the seal bit to a first state in response to a condition in which the arm bit is in the first state and the first signal indicates that the meter cover is installed;
   f) using the processing circuit to change the state of the seal bit to a second state in response to a condition in which the seal bit is in the first state and the first signal indicates that the meter cover is removed.

2. The method of claim 1, further comprising:
   g) upon applying electrical power to the meter, obtaining in the processing circuit a second signal indicating whether the meter cover was removed after a last time that power was applied to the meter.

3. The method of claim 2, further comprising, upon applying electrical power to the meter,
   using the processing circuit to change the seal bit to the second state in response to a condition in which the seal bit is in the first state and the second signal indicates that the meter cover was removed after the last time that power was applied to the meter.

4. The method of claim 1, wherein the first set of conditions includes:
   the first signal indicates that the cover is removed; and
   an arm signal is received via an optical port of the meter.

5. The method of claim 1, wherein step e) further comprises:
   e) changing the arm bit to second state in response to the condition in which the arm bit is in the first state and the first signal indicates that the meter cover is installed.

6. The method of claim 5, further comprising:
   g) retaining the seal bit in the second state in response to a condition in which the arm bit is in the second state and the first signal indicates that the meter cover is installed.

7. The method of claim 2, wherein the second signal comprises a flag stored in a memory.

8. An arrangement for use in a utility meter, comprising:
   a non-volatile memory within a meter housing having at least a first memory location storing an arm bit and a second memory location storing a seal bit;
   a processing device within the meter housing, the processing device configured to perform a set of start-up operations upon application of bias power to an input, the processing device further configured by program instructions to
   change a state of the arm bit to a first state in response to a first set of conditions;
   in performing the start-up operations, obtain a first signal indicating whether a meter cover is installed or the meter cover is removed;
   change the state of the seal bit to a first state in response to a condition in which the arm bit is in the first state and the first signal indicates that the meter cover is installed;

change the state of the seal bit to a second state in response to a condition in which the seal bit is in the first state and the first signal indicates that the meter cover is removed.

9. The arrangement of claim 8, wherein the processing circuit is further configured to:
in performing the start-up operations, obtain a second signal indicating whether the meter cover was removed after a last time that power was applied to the meter.

10. The arrangement of claim 9, wherein the processing circuit is further configured to, in performing the start-up operations, to change the seal bit to the second state in response to a condition in which the seal bit is in the first state and the second signal indicates that the meter cover was removed after a last time that power was applied to the meter.

11. The arrangement of claim 8, wherein the first set of conditions includes:
the first signal indicates that the cover is removed; and
an arm signal is received via an optical port of the meter.

12. The arrangement of claim 8, wherein the processing circuit is further configured to, in performing the start-up operations,
change the arm bit to second state in response to the condition in which the arm bit is in the first state and the first signal indicates that the meter cover is installed.

13. The arrangement of claim 8, wherein the processing circuit is further configured to retain the seal bit in the second state in response to a condition in which the arm bit is in the second state and the first signal indicates that the meter cover is installed.

14. The arrangement of claim 8, further comprising a metrology circuit supported by the meter housing, the metrology circuit configured to detect electricity delivered to a load and generate energy consumption related information therefrom.

15. The arrangement of claim 14, wherein the processing circuit forms a part of the metrology circuit.

16. The arrangement of claim 15, wherein the metrology circuit further comprises voltage sensors and current sensors operably coupled to the processing circuit.

17. The arrangement of claim 14, wherein the metrology circuit further comprises voltage sensors and current sensors operably coupled to the processing circuit.

* * * * *